United States Patent
Chen et al.

(10) Patent No.: US 9,678,169 B2
(45) Date of Patent: Jun. 13, 2017

(54) TESTING ASSEMBLY FOR TESTING MAGNETIC SENSOR AND METHOD FOR TESTING MAGNETIC SENSOR

(71) Applicant: Voltafield Technology Corp., Zhubei, Hsinchu County (TW)

(72) Inventors: Kuang-Ching Chen, Changhua County (TW); Jia-Mou Lee, New Taipei (TW); Tai-Lang Tang, Zhubei (TW); Chien-Min Lee, Hsinchu County (TW); Ming-Sheng Yang, Hsinchu (TW)

(73) Assignee: Voltafield Technology Corp., Zhubei (TW)

( * ) Notice: Subject to any disclaimer, the term of this patent is extended or adjusted under 35 U.S.C. 154(b) by 356 days.

(21) Appl. No.: 14/326,539

(22) Filed: Jul. 9, 2014

(65) Prior Publication Data

US 2016/0011277 A1    Jan. 14, 2016

(51) Int. Cl.
  *G01R 33/00*  (2006.01)
  *G01R 31/28*  (2006.01)
  *G01R 35/00*  (2006.01)

(52) U.S. Cl.
  CPC ..... *G01R 33/0023* (2013.01); *G01R 31/2896* (2013.01); *G01R 35/00* (2013.01)

(58) Field of Classification Search
  None
  See application file for complete search history.

(56) References Cited

U.S. PATENT DOCUMENTS

| | | | | |
|---|---|---|---|---|
| 3,956,693 A | * | 5/1976 | Zutrauen | G01V 13/00 324/207.16 |
| 5,589,772 A | * | 12/1996 | Kugai | G01N 27/82 324/240 |
| 7,183,763 B1 | * | 2/2007 | Murata | G01R 31/2886 324/212 |
| 7,345,470 B2 | * | 3/2008 | Suzuki | G01R 31/2829 324/202 |
| 7,800,381 B2 | | 9/2010 | Marbler | |
| 8,451,016 B2 | | 5/2013 | Shankar et al. | |
| 8,847,586 B2 | * | 9/2014 | Suzuki | G01R 35/00 324/224 |
| 9,035,671 B2 | * | 5/2015 | Liu | G01R 35/00 324/756.02 |
| 2006/0049823 A1 | * | 3/2006 | Suzuki | G01R 31/2829 324/202 |
| 2009/0079449 A1 | * | 3/2009 | Marbler | G01R 31/002 324/762.05 |

(Continued)

FOREIGN PATENT DOCUMENTS

KR    20150014567 A  *  2/2015  ........  G01R 33/0011

*Primary Examiner* — Jermele M Hollington
(74) *Attorney, Agent, or Firm* — Alan D. Kamrath; Kamrath IP Lawfirm, P.A.

(57) ABSTRACT

A testing assembly for testing a magnetic sensor comprises a testing interface and a detachable magnetic-field generator. The testing interface has a base plate and plurality of testing terminals. The base plate has a first side and a second side opposite to the first side. The plurality of testing terminals is arranged on the first side of the base plate. The detachable magnetic-field generator is arranged on the second side of the base plate in a detachable fashion. The detachable magnetic-field generator has a coil support and at least one coil winding around the coil support.

8 Claims, 13 Drawing Sheets

(56) References Cited

U.S. PATENT DOCUMENTS

| | | | |
|---|---|---|---|
| 2009/0091344 A1* | 4/2009 | Ausserlechner | G01D 5/145 324/754.29 |
| 2013/0009659 A1* | 1/2013 | Liu | G01R 35/00 324/756.02 |
| 2015/0042318 A1* | 2/2015 | Youm | G01R 35/00 324/202 |
| 2015/0160010 A1* | 6/2015 | Tang | G01R 33/0206 33/355 R |

* cited by examiner

TESTING ASSEMBLY FOR TESTING MAGNETIC SENSOR AND METHOD FOR TESTING MAGNETIC SENSOR

FIELD OF THE INVENTION

The present invention relates to a testing assembly for testing a magnetic sensor and a method for testing a magnetic sensor, particularly to a testing assembly comprising a testing interface and a detachable magnetic-field generator and a method for testing a magnetic sensor by using the testing assembly.

BACKGROUND OF THE INVENTION

A magnetic sensor can sense a change of the external magnetic field. A magnetic sensor can be used to detect rotation, angle, on/off state, position, presence, proximity, etc. There are many types of technologies that can be used to make a magnetic sensor such as Hall Effect, magnetoresistive, magnetoinductive, proton precession, optical pump, nuclear precession, and SQUID (superconducting quantum interference devices). Taking the magnetoresistive technology as an example, according to the magnetoresistive materials used, magnetic sensors can be categorized into anisotropic magnetoresistive material (AMR), giant magnetoresistive material (GMR) and tunneling magnetoresistive material (TMR) according to how they function and their sensitivities.

Most of these magnetic sensors are made as semiconductor devices, so their completion usually involves several steps: manufacturing from a substrate, wafer-level testing, singulation, packaging into individual chips and package-level testing. Wafer-level testing and package-level testing typically involve testing the functionality of devices such as memory cells and magnetic sensors formed in a wafer or a packaged integrated circuit (IC) with a tester comprising a testing interface. For magnetic sensors, wafer-level testing or package-level testing needs to generate an external magnetic field in order to test the performance of the magnetic sensors such as sensitivities in terms of different axes and accuracies in terms of different axies.

SUMMARY OF THE INVENTION

The object of this invention is to provide a flexible and inexpensive testing assembly for testing magnetic sensors. This testing assembly is compatible with different kinds of testers and is capable of measuring two-dimensional sensing performance or three-dimensional sensing performance.

The present invention provides a testing assembly for testing a magnetic sensor comprising a testing interface and a detachable magnetic-field generator. The testing interface has a base plate and plurality of testing terminals. The base plate has a first side and a second side opposite to the first side. The plurality of testing terminals is arranged on the first side of the base plate. The detachable magnetic-field generator is arranged on the second side of the base plate in a detachable fashion. The detachable magnetic-field generator has a coil support and at least one coil winding around the coil support.

The present invention further provides a method for testing a magnetic sensor. This method comprises a step of bringing a testing assembly toward the magnetic sensor. The testing assembly comprises a testing interface and a detachable magnetic-field generator. The testing interface has a base plate and plurality of testing terminals. The base plate has a first side and a second side opposite to the first side. The plurality of testing terminals is arranged on the first side of the base plate. The detachable magnetic-field generator is arranged on the second side of the base plate in a detachable fashion. The detachable magnetic-field generator has a coil support and at least one coil winding around the coil support. This method further comprises a step of coupling the magnetic sensor with distal ends of the testing terminals, a step of imposing a magnetic field to the magnetic sensor by supplying current to the at least one coil, and a step of obtaining a response signal from the magnetic sensor via the testing terminals.

In one embodiment of the present invention, the at least one coil is configured to generate a magnetic field perpendicular to the base plate and/or a magnetic field along a first direction parallel to the base plate and/or a magnetic field along a second direction parallel to the base plate with the first direction perpendicular to the second direction.

In one embodiment of the present invention, the testing assembly is configured to be installed into a wafer-level tester or a package-level tester.

In one embodiment of the present invention, the coil support of the testing assembly is made from iron, a ferrite material, a permalloy, an insulating material or a combination thereof.

DETAILED DESCRIPTION OF THE INVENTION

The following embodiments describe principles and constructions of test assemblies for testing magnetic sensors according embodiments of the present invention. It will be apparent that these embodiments may be practiced without some or all of these specific details. In other instances, well known process operations have not been described in detail in order not to unnecessarily obscure the present invention.

The following descriptions illustrate preferred embodiments of the present invention in detail. All the components, sub-portions, structures, materials and arrangements therein can be arbitrarily combined in any sequence despite their belonging to different embodiments and having different sequence originally. All these combinations are falling into the scope of the present invention. A person of ordinary skills in the art, upon reading the present invention, can change and modify these components, sub-portions, structures, materials and arrangements therein without departing from the spirits and scope of the present invention. These changes and modifications should fall in the scope of the present invention defined by the appended claims.

There are a lot of embodiments and figures within this application. To avoid confusions, similar components are designated by the same or similar numbers. To simplify figures, repetitive components are only marked once. The purpose of figures is to convey concepts and spirits of the present invention, so all the distances, sizes, scales, shapes and connections are explanatory and exemplary but not realistic. Other distances, sizes, scales, shapes and connections that can achieve the same functions or results in the same way can be adopted as equivalents.

Figure 1:
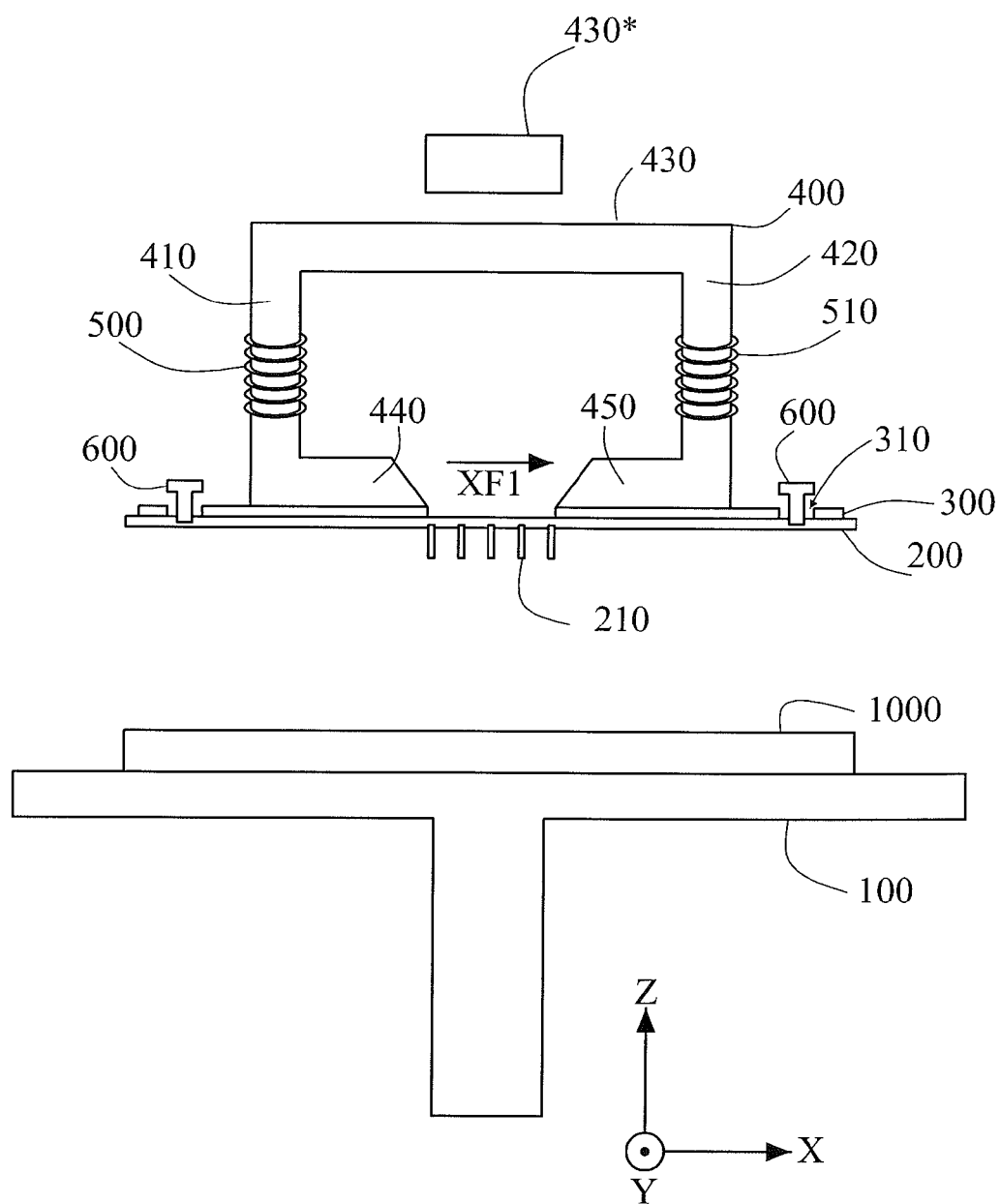
FIG. 1 illustrates a testing assembly for testing magnetic sensors according to one embodiment of the present invention.

Please refer to FIG. 1. FIG. 1 illustrates a testing assembly for testing magnetic sensors according to one embodiment of the present invention. The testing assembly comprises a testing interface and a magnetic-field generator. The testing interface comprises a base plate 200 and a plurality of testing terminals 210 disposed on the lower side of the base plate 200. The testing terminals 210 are configured to electrically couple the magnetic sensors to be tested in order to impose current/voltage and/or collect response current/voltage. The testing interface is configured to be installed into a wafer tester (not shown) for wafer-level testing or to be installed into a package tester (not shown) for package-level testing. Although the embodiments of the present invention take a wafer-level testing involving a wafer 1000 disposed under the testing interface as an example, the testing assembly and the method for testing magnetic devices of the present invention can be used in a package-level testing involving a packaged IC (not shown). In a package-level testing, the testing interface could be a socket and a packaged IC could be disposed on the socket. In this embodiment, the testing interface is a probe card with the base plate 200 being a printed circuit board (PCB) and the testing terminals 210 being probe pins. In this embodiment, the wafer 1000 having magnetic sensors to be tested is disposed under the testing interface and supported by a wafer support 100 of the wafer tester (not shown). The wafer 1000 is preferably parallel to the base plate 200 of the testing interface.

Figure 2:
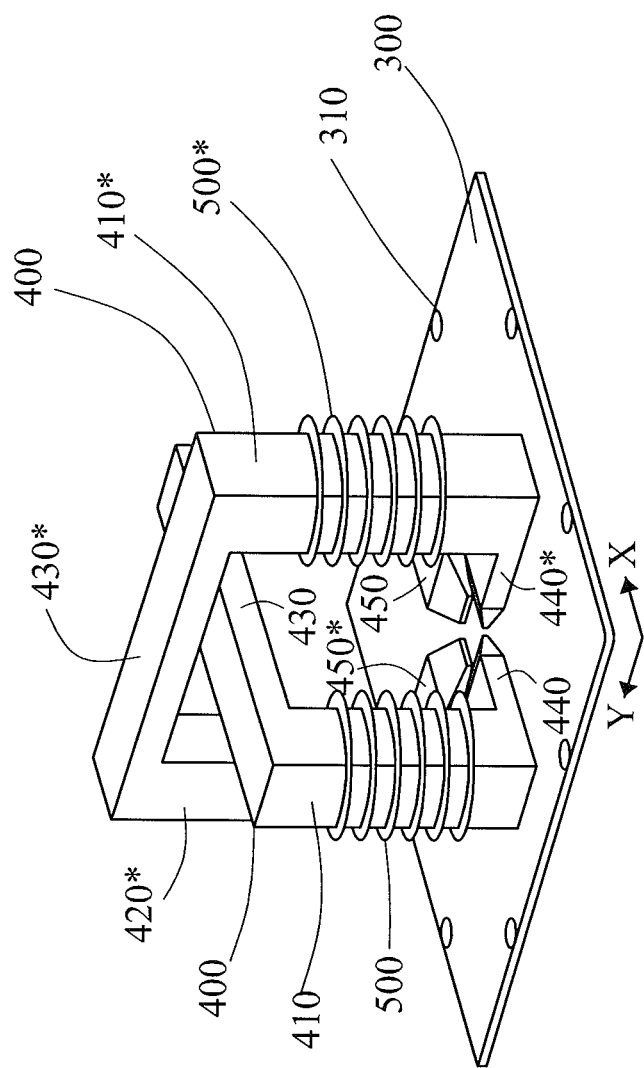
FIG. 2 shows the schematic three-dimensional view of the detachable magnetic-field generator of the testing assembly of FIG. 1 according to one embodiment of the present invention.
Figure 3A:
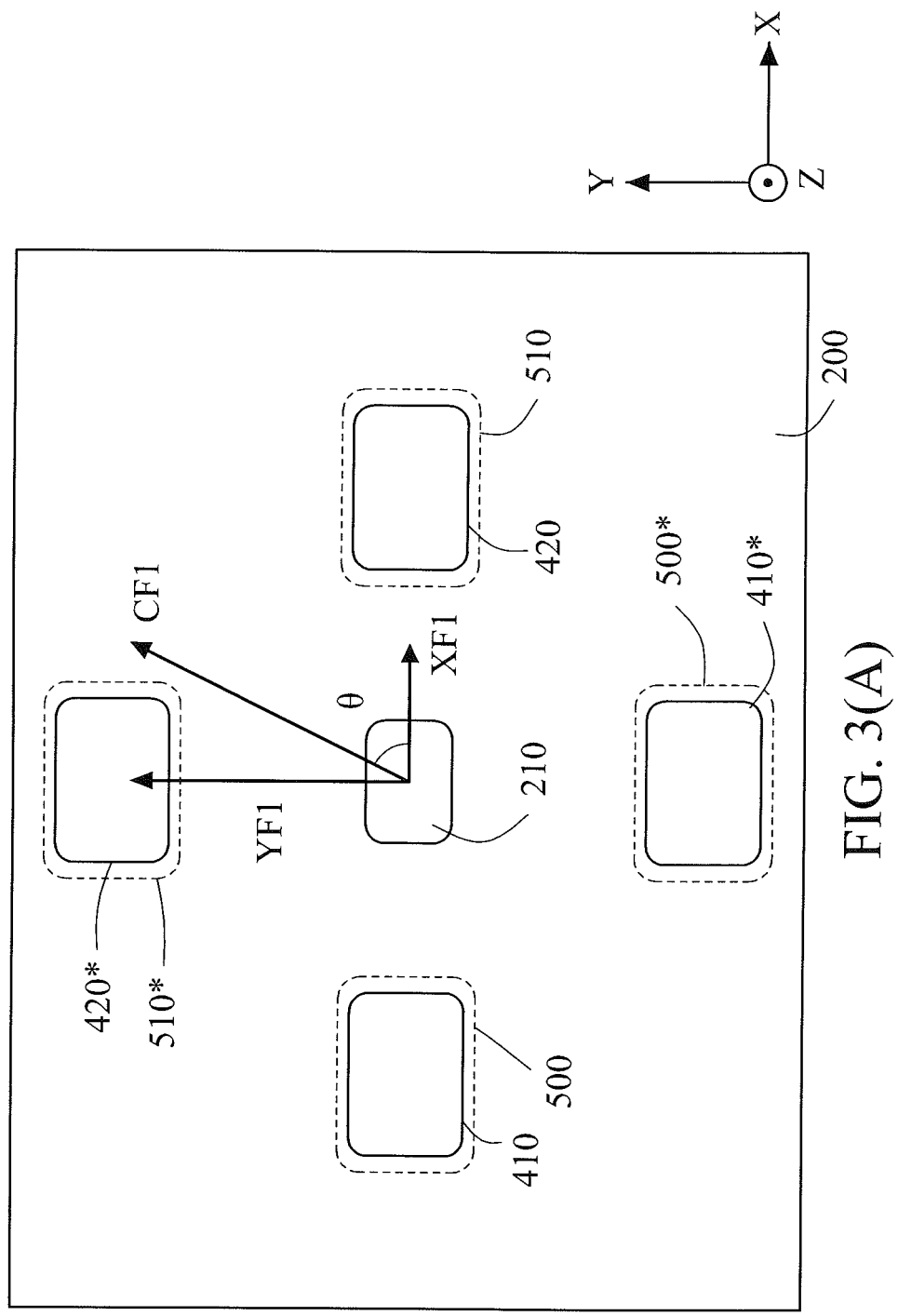
FIG. 3(A) is a simplified top view of the magnetic-field generator illustrating the relationship between the coils of the magnetic-field generator of FIGS. 1 and 2 and the magnetic fields generated therefrom.

Please still refer to FIGS. 1, 2 and 3(A). FIG. 2 shows the schematic three-dimensional view of the detachable magnetic-field generator of the testing assembly of FIG. 1 according to one embodiment of the present invention. FIG. 3(A) is a simplified top view of the magnetic-field generator illustrating the relationship between the coils of the magnetic-field generator of FIGS. 1 and 2 and the magnetic fields generated therefrom. In this embodiment, the detachable magnetic-field generator mainly comprises a coil support 400 and four coils 500, 510, 500* and 510*. In this embodiment, the coil support 400 mainly comprises four vertical portions 410, 420, 410* and 420* for coils 500, 510, 500* and 510* to wind around respectively. Two of the vertical portions, 410 and 420, are disposed along x-axis and perpendicular to the base plate 200 of the testing interface, hence perpendicular to the wafer 1000. The other two of the vertical portions, 410* and 420*, are disposed along y-axis and perpendicular to the base plate 200 of the testing interface, hence perpendicular to the wafer 1000. The coil support 400 optionally comprises four legs 440, 450, 440* and 450* coupled to four vertical portions 410, 420, 410* and 420* respectively. These four legs 440, 450, 440* and 450* are preferably parallel to the base plate 200 of the testing interface, hence parallel to the wafer 1000. Two of these four legs, 440 and 450 are arranged along x-axis and the other two of these four legs, 440* and 450* are arranged along y-axis. The coil support 400 further optionally comprises two horizontal portions 430 and 430* preferably parallel to the base plate 200 of the testing interface. The horizontal portion 430 is arranged along x-axis while the horizontal portion 430* is arranged along y-axis. The horizontal portion 430 is coupled to the vertical portion 410 at one end and is coupled to the vertical portion 420 at the other end. Similarly, the horizontal portion 430* is coupled to the vertical portion 410* at one end and is coupled to the vertical portion 420* at the other end.

The legs 440 and 450, the vertical portions 410 and 420, and the horizontal portion 430 are coupled together by fasteners or they may be formed in one structure. The legs 440 and 450, the vertical portions 410 and 420, and the horizontal portion 430 are all disposed along x-axis and collectively form a semi-loop along x-axis with an opening between the two legs 440 and 450. Similarly, the legs 440* and 450*, the vertical portions 410* and 420*, and the horizontal portion 430* are coupled together by fasteners or they may be formed in one structure. The legs 440* and 450*, the vertical portions 410* and 420*, and the horizontal portion 430* are all disposed along y-axis and collectively form a semi-loop along y-axis with an opening between the two legs 440* and 450*. In a preferred embodiment, the testing terminals are disposed in an area corresponding to the opening surrounded by the four legs 440, 450, 440* and 450*. In order to firmly fix the detachable magnetic-field generator to the testing interface, a positioning plate 300 and a plurality of fasteners 600 are used. The detachable magnetic-field generator is installed on the positioning plate 300 and the positioning plate 300 is installed on the upper side of the base plate 200 of the testing interface via fasteners 600. That is, the detachable magnetic-field generator and the testing terminals are disposed on opposite sides of the base plate 200. The detachable magnetic-field generator may also be installed on the positioning plate 300 via fasteners (not shown). Alternatively, the detachable magnetic-field generator may be permanently fixed on the positioning plate 300 through glue or by welding as long as the positioning plate 300 is detachable from the base plate 200. In this embodiment, the positioning plate 300 comprises a plurality of positioning holes 310. The fasteners 600 may go through the positioning holes 310 and couple the positioning plate 300 to the base plate 200. In this embodiment, the fasteners 600 may be screws. Other fasteners such as clamps, clutches and clips may be used.

In the simplified top view of FIG. 3(A), the magnetic-field generator is partially shown (only the vertical portions 410, 420, 410* and 420* of coil support 400) and the testing terminals 210 are shown as a corner-rounded rectangle which is an area occupied by the testing terminals 210. Since the coils 500, 510, 500* and 510* wind around the vertical portions 410, 420, 410* and 420* respectively, the shapes and cross sectional areas of the vertical portions would define the shapes and sizes of the coils. The shapes of vertical portions may be circle, oval, corner-rounded rectangle, hexagon, octagon, etc. In a preferred embodiment, the four vertical portions have the same shape and the same cross sectional area. The semi-loop along x-axis (the legs 440 and 450, the vertical portions 410 and 420, and the horizontal portion 430 collectively) and the semi-loop along y-axis (the legs 440* and 450*, the vertical portions 410* and 420*, and the horizontal portion 430* collectively) may be formed from iron, a ferrite material, permalloy or a combination thereof in order to enhance the magnetic field generated from the coil. When electrical currents are supplied to the coils 500 and 510 that electrical current flowing in the coil 500 follows a clockwise direction and electrical current flowing in the coil 510 follows a counterclockwise direction, inside the coil 500 a magnetic field pointing −Z direction (into the paper) and inside the coil 510 a magnetic field pointing +Z direction (out the paper) would be generated. Between the coils 500 and 510 where the testing terminals 210 are disposed, a magnetic field XF1 pointing from the coil 500 toward the coil 510 (along x-axis) is generated. Similarly, when electrical currents are supplied to the coils 500* and 510* that electrical current flowing in the coil 500* follows a clockwise direction and electrical current flowing in the coil 510* follows a counterclockwise direction, inside the coil 500* a magnetic field pointing −Z direction (into the paper) and inside the coil 510* a magnetic field pointing +Z direction (out the paper) would be generated. Between the coils 500* and 510* where the testing terminals 210 are disposed, a magnetic field YF1 pointing from the coil 500* toward the coil 510* (along y-axis) is generated. That is, at the testing terminals 210, a combined magnetic field CF1 of the magnetic field XF1 and the magnetic field YF1 can be generated. This combined magnetic field CF1 would be the external magnetic field felt by the magnetic sensor under test while the testing terminals 210 are electrically coupled to the magnetic sensor. In this embodiment, the combined magnetic field XF1 forms an angle θ with respect to x-axis. The magnitude and the angle θ (direction) of the combined magnetic field XF1 depend on the magnitudes and directions of the magnetic field XF1 and the magnetic field YF1. The magnitudes and directions of the magnetic field XF1 and the magnetic field YF1 depend on the currents supplied to the coils and a space arrangement of the coils. Different sets of the magnetic field XF1 and the magnetic field YF1 can make different combined magnetic field CF1.

In the embodiment of FIGS. 1-3(A), by adjusting the magnitudes of the currents supplied to the coils 410 and 420 and the magnitudes of the currents supplied to the coils 410* and 420* and by adjusting the current directions (clockwise or counterclockwise) of the coils 410 and 420 and the current directions (clockwise or counterclockwise) of the coils 410* and 420*, one can create different kinds of magnetic fields in the x-y plane.

Figure 3B:
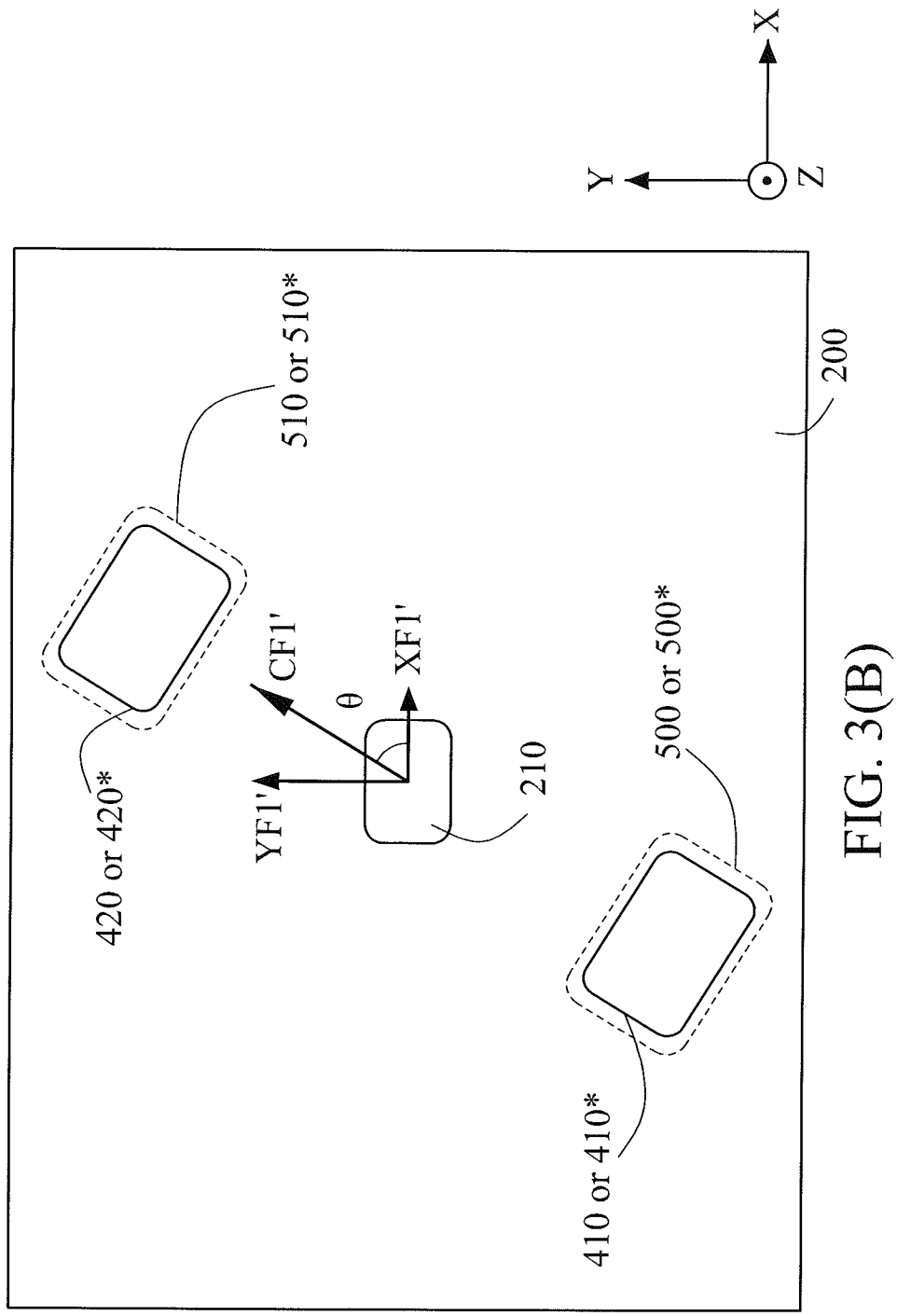
FIG. 3(B) is a simplified top view of the magnetic-field generator illustrating the relationship between the coils of the magnetic-field generator according to one embodiment and the magnetic fields generated therefrom.

Please still refer to FIGS. 1, 2 and 3(B). FIG. 3(B) is a simplified top view of the magnetic-field generator illustrating the relationship between the coils of the magnetic-field generator according to one embodiment of the present invention and the magnetic fields generated therefrom. This embodiment is a variation of the embodiment shown in FIGS. 1, 2 and 3(A). In this embodiment, the detachable magnetic-field generator only comprises one of the semi-loops disclosed in the embodiment shown in FIGS. 1, 2 and 3(A). That is, the detachable magnetic-field generator may only comprise the legs 440 and 450, the vertical portions 410 and 420, and the horizontal portion 430 or may only comprise the legs 440* and 450*, the vertical portions 410* and 420*, and the horizontal portion 430*. Furthermore, the vertical portions 410 and 420 or the vertical portions 410* and 420* are not disposed along x-axis or y-axis. Therefore, the coils 500 and 510 or the coils 500* and 510* winding around the vertical portions 410 and 420 or the vertical portions 410* and 420* respectively are not disposed along x-axis or y-axis. When electrical currents are supplied to the coils 500 and 510 (or coils 500* and 510*) that electrical current flowing in the coil 500 (or 500*) follows a clockwise direction and electrical current flowing in the coil 510 (or 510*) follows a counterclockwise direction, inside the coil 500 (or 500*) a magnetic field pointing −Z direction (into the paper) and inside the coil 510 (or 510*) a magnetic field pointing +Z direction (out the paper) would be generated. Between the coils 500 and 510 (or 500* and 510*) where the testing terminals 210 are disposed, a magnetic field CF1' pointing from the coil 500 (or 500*) toward the coil 510 (or 510*) is generated. That is, at the testing terminals 210, a magnetic field CF1' can be generated. This magnetic field CF1' would be the external magnetic field felt by the magnetic sensor under test while the testing terminals 210 are electrically coupled to the magnetic sensor. This magnetic field CF1' can be divided into a magnetic field XF1' along the x-axis and a magnetic field YF1' along the y-axis. In this embodiment, the created magnetic field CF1' forms an angle θ with respect to x-axis. The coils 500 and 510 (or 500* and 510*) are disposed along the direction of the created magnetic field CF1'. The magnitude and the angle θ (direction) of the created magnetic field CF1' depend on the currents supplied to the coils and a space arrangement of the coils 500 and 510 (or 500* and 510*).

Figure 3C:
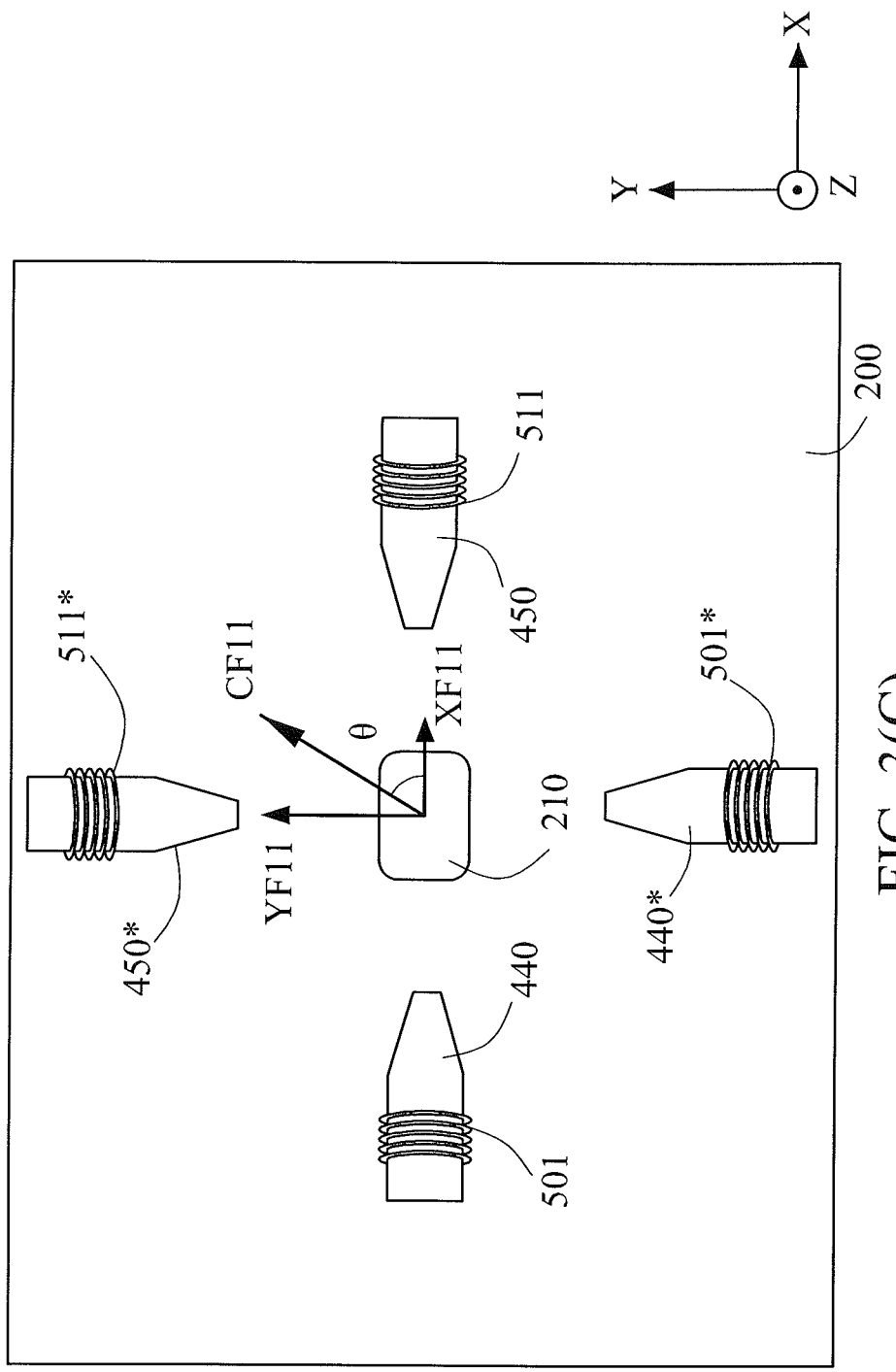
FIG. 3(C) is a simplified top view of the magnetic-field generator illustrating the relationship between the coils of the magnetic-field generator according to another embodiment and the magnetic fields generated therefrom.

Please still refer to FIGS. 1, 2 and 3(C). FIG. 3(C) is a simplified top view of the magnetic-field generator illustrating the relationship between the coils of the magnetic-field generator according to another embodiment of the present invention and the magnetic fields generated therefrom. This embodiment is another variation of the embodiment shown in FIGS. 1, 2 and 3(A). In this embodiment, the detachable magnetic-field generator may comprise the same legs 440, 450 440* and 450* and optionally comprise the same vertical portions 410, 420, 410* and 420* and the same horizontal portions 430 and 430*. The legs 440 and 450 are disposed along x-axis while the legs 440* and 450* are disposed along y-axis. In this embodiment, the coils do not wind around the vertical portions but wind around the legs. That is, coils 501 and 511 wind around the legs 440 and 450 respectively and coils 501* and 511* wind around the legs 440* and 450*. The coils 500, 510, 500* and 510* winding around the vertical portions 410, 420 and 410* and 420* respectively do not exist in this embodiment and their functions are replaced by the coils 501, 511, 501* and 511*.

When electrical currents are supplied to the coils 501 and 511 that electrical current flowing in the coil 501 follows a top-to-down direction (viewed in top view for a part of the coil 501 above the leg 440) and electrical current flowing in the coil 511 follows a top-to-down direction (viewed in top view for a part of the coil 511 above the leg 450) direction, inside the coil 501 a magnetic field pointing +X direction and inside the coil 511 a magnetic field pointing +X direction would be generated. Between the coils 501 and 511 where the testing terminals 210 are disposed, a magnetic field XF11 pointing from the coil 501 toward the coil 511 (along x-axis) is generated. Similarly, when electrical currents are supplied to the coils 501* and 511* that electrical current flowing in the coil 501* follows a left-to-right direction (viewed in top view for a part of the coil 501* above the leg 440*) and electrical current flowing in the coil 511* follows a left-to-right direction (viewed in top view for a part of the coil 511* above the leg 450*), inside the coil 501* a magnetic field pointing +Y direction and inside the coil 511* a magnetic field pointing +Y direction would be generated. Between the coils 501* and 511* where the testing terminals 210 are disposed, a magnetic field YF11 pointing from the coil 501* toward the coil 511* (along y-axis) is generated. That is, at the testing terminals 210, a combined magnetic field CF11 of the magnetic field XF11 and the magnetic field YF11 can be generated. This combined magnetic field CF11 would be the external magnetic field felt by the magnetic sensor under test while the testing terminals 210 are electrically coupled to the magnetic sensor. In this embodiment, the combined magnetic field XF11 forms an angle θ with respect to x-axis. The magnitude and the angle θ (direction) of the combined magnetic field XF11 depend on the magnitudes and directions of the magnetic field XF11 and the magnetic field YF11. The magnitudes and directions of the magnetic field XF11 and the magnetic field YF11 depend on the currents supplied to the coils and a space arrangement of the coils. Different sets of the magnetic field XF11 and the magnetic field YF11 can make different combined magnetic field CF11.

Figure 3D:
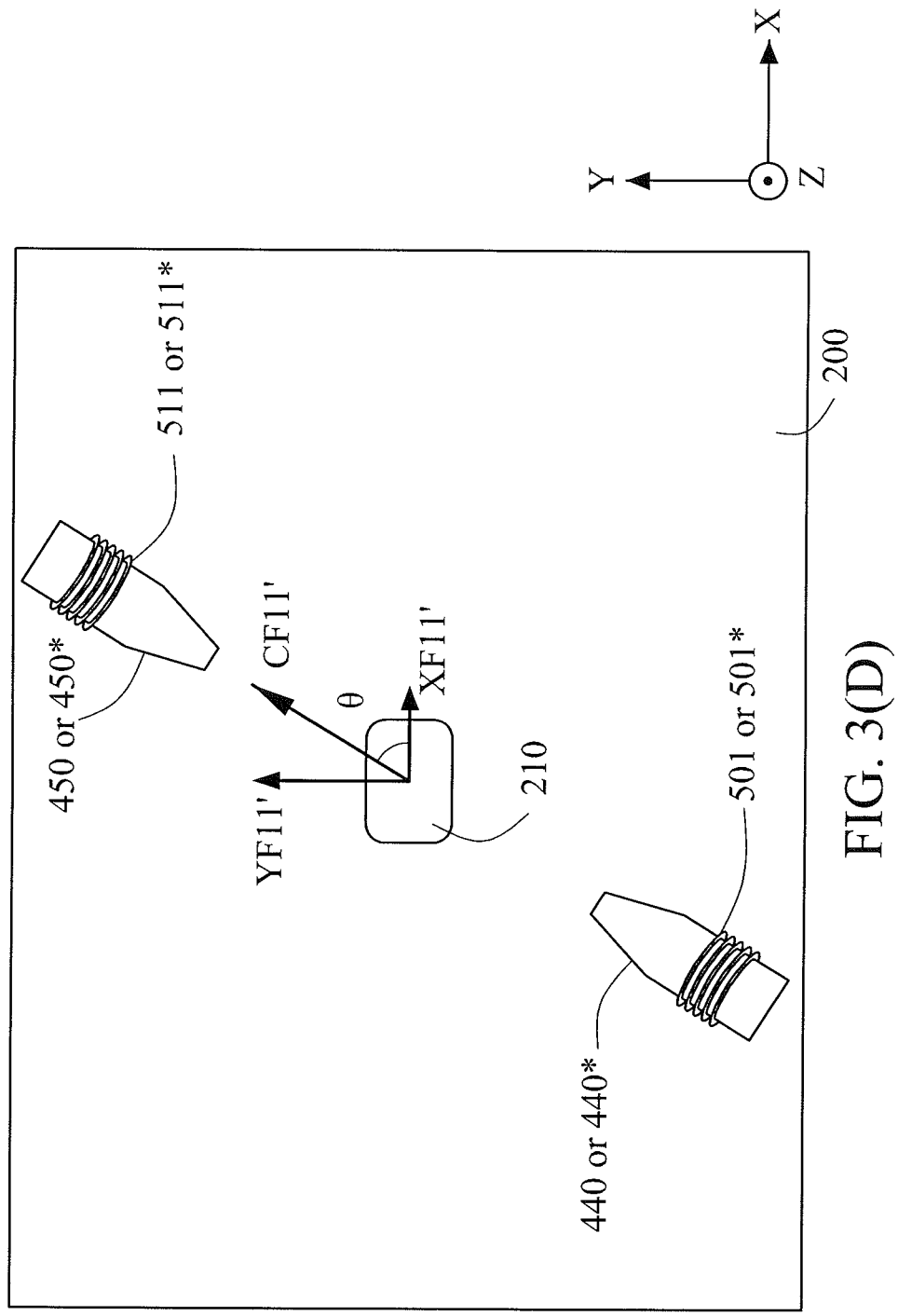
FIG. 3(D) is a simplified top view of the magnetic-field generator illustrating the relationship between the coils of the magnetic-field generator according to yet another embodiment and the magnetic fields generated therefrom.

Please still refer to FIGS. 1, 2 and 3(D). FIG. 3(D) is a simplified top view of the magnetic-field generator illustrating the relationship between the coils of the magnetic-field generator according to yet another embodiment of the present invention and the magnetic fields generated therefrom. This embodiment is a variation of the embodiment shown in FIGS. 1, 2 and 3(C). In this embodiment, the detachable magnetic-field generator may only comprises one of the semi-loops disclosed in the embodiment shown in FIGS. 1, 2 and 3(A). That is, the detachable magnetic-field generator may only comprise the legs 440 and 450, the vertical portions 410 and 420, and the horizontal portion 430 or may only comprise the legs 440* and 450*, the vertical portions 410* and 420*, and the horizontal portion 430*. If the detachable magnetic-field generator comprises the former set (the legs 440 and 450, the vertical portions 410 and 420, and the horizontal portion 430), the vertical portions and the horizontal portion are optionally included. If the detachable magnetic-field generator comprises the later set (the legs 440* and 450*, the vertical portions 410* and 420*, and the horizontal portion 430*), the vertical portions and the horizontal portion are optionally included. Furthermore, the legs 440 and 450 or the legs 440* and 450* are not disposed along x-axis or y-axis. Therefore, the coils 501 and 511 or the coils 501* and 511* winding around the legs 440 and 450 or the legs 440* and 450* respectively are not disposed along x-axis or y-axis. When electrical currents are supplied to the coils 501 and 511 (or coils 501* and 511*) that electrical current flowing in the coil 501 (or 501*) flows from upper left to lower right (viewed in top view for a part of the coil 501/501* above the leg 440/440*) and electrical current flowing in the coil 511 (or 511*) flows from upper left to lower right (viewed in top view for a part of the coil 511/511* above the leg 450/450*), inside the coil 501 (or 501*) a magnetic field pointing CF11' direction and inside the coil 511 (or 511*) a magnetic field pointing CF11' direction would be generated. Between the coils 501 and 511 (or 501* and 511*) where the testing terminals 210 are disposed, a magnetic field CF11' pointing from the coil 501 (or 501*) toward the coil 511 (or 511*) is generated. That is, at the testing terminals 210, a magnetic field CF11' can be generated. This magnetic field CF11' would be the external magnetic field felt by the magnetic sensor under test while the testing terminals 210 are electrically coupled to the magnetic sensor. This magnetic field CF11' can be divided into a magnetic field XF11' along the x-axis and a magnetic field YF11' along the y-axis. In this embodiment, the created magnetic field CF11' forms an angle θ with respect to x-axis. The coils 501 and 511 (or 501* and 511*) are disposed along the direction of the created magnetic field CF11'. The magnitude and the angle θ (direction) of the created magnetic field CF11' depend on the currents supplied to the coils and a space arrangement of the coils 501 and 511 (or 501* and 511*).

Figure 4:
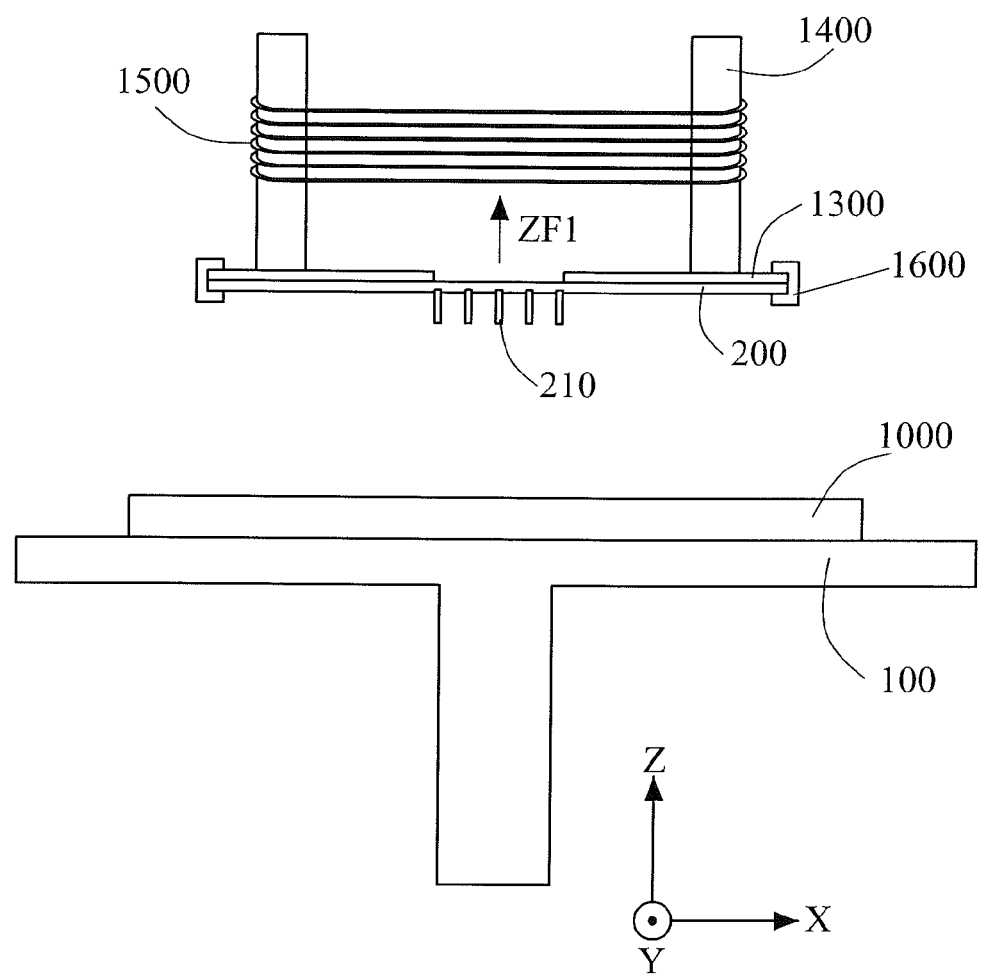
FIG. 4 illustrates a testing assembly for testing magnetic sensors according to another embodiment of the present invention.
Figure 5:
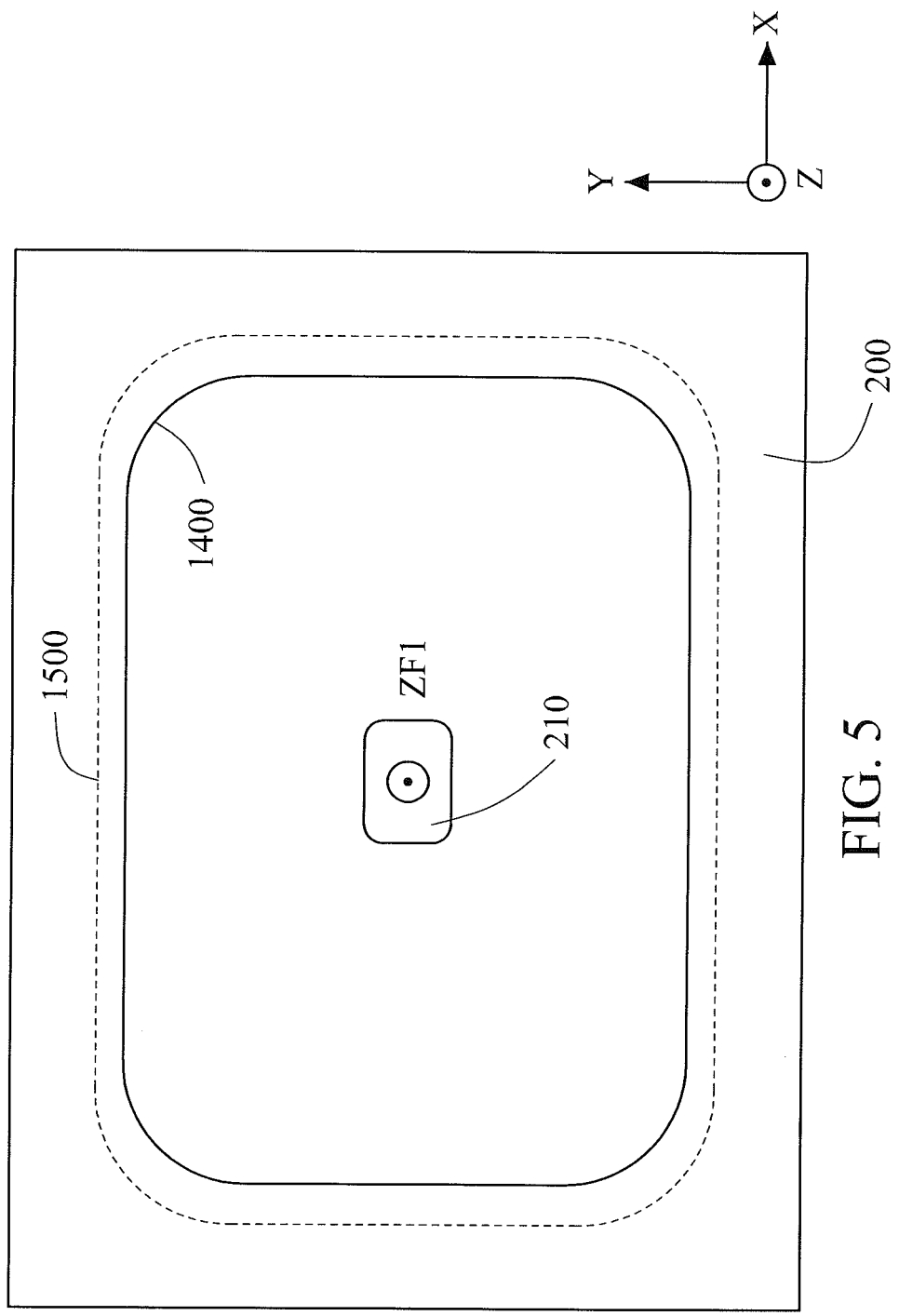
FIG. 5 is a simplified top view of the magnetic-field generator illustrating the relationship between the coil of the magnetic-field generator of FIG. 4 and the magnetic field generated therefrom.

Please refer to FIGS. 4 and 5. FIG. 4 illustrates a testing assembly for testing magnetic sensors according to another embodiment of the present invention. FIG. 5 is a simplified top view of the magnetic-field generator illustrating the relationship between the coil of the magnetic-field generator of FIG. 4 and the magnetic field generated therefrom. The testing assembly comprises a testing interface and a magnetic-field generator. The testing interface is the same as the testing interface shown in FIG. 1 and comprises the same base plate 200 and a plurality of testing terminals 210 shown in FIG. 1. In this embodiment, the wafer 1000 and the wafer support 100 are also the same as the ones shown in FIG. 1. Their details are omitted here. In this embodiment, the detachable magnetic-field generator mainly comprises a coil support 1400 and one coil 1500 winding around the coil support 1400. In this embodiment, the coil support 1400 is a loop structure of corner-rounded rectangular shape and the testing terminals are disposed in an area corresponding to a center area of the coil support 1400. In order to firmly fix the detachable magnetic-field generator to the testing interface, a positioning plate 1300 and a plurality of fasteners 1600 are used. The detachable magnetic-field generator is installed on the positioning plate 1300 and the positioning plate 1300 is installed on the upper side of the base plate 200 of the testing interface via fastener(s) 1600. That is, the detachable magnetic-field generator and the testing terminals are disposed on opposite sides of the base plate 200. The detachable magnetic-field generator may also be installed on the positioning plate 1300 via fasteners (not shown). Alternatively, the detachable magnetic-field generator may be permanently fixed on the positioning plate 1300 through glue or by welding as long as the positioning plate 1300 is detachable from the base plate 200. In this embodiment, the positioning plate 1300 does not comprise a plurality of positioning holes. The fastener(s) 1600 couple the positioning plate 1300 to the base plate 200 by clamping the edges of the positioning plate 1300 and the base plate 200 together. In this embodiment, the fastener(s) 600 may be a clamp ring. Other fasteners such as clutches and clips may be used.

In the simplified top view of FIG. 5, the testing terminals 210 are shown as a corner-rounded rectangle which is an area occupied by the testing terminals 210. Since the coil 1500 winds around the coil support 1400, the shape and cross sectional area of the coil support 1400 would define the shape and size of the coil 1500. The shape of the coil support may be circle, oval, corner-rounded rectangle, hexagon, octagon, etc. The coil support 1400 may be formed from iron, a ferrite material, permalloy or a combination thereof in order to enhance the magnetic field generated from the coil. Alternatively, the coil support 1400 may be formed from an insulating material. When electrical current is supplied to the coil 1500 that the electrical current flowing in the coil 1500 follows a counterclockwise direction, inside the coil 1500 a magnetic field ZF1 pointing +Z direction (out the paper) would be generated. Since the testing terminals 210 are disposed in an area corresponding to the center area of the coil 1500, the magnetic field ZF1 pointing +Z direction (out the paper) would be the external magnetic field felt by the magnetic sensor under test while the testing terminals 210 are electrically coupled to the magnetic sensor. The magnitude of the magnetic field ZF1 depends on the current supplied to the coil 1500.

Figure 6:
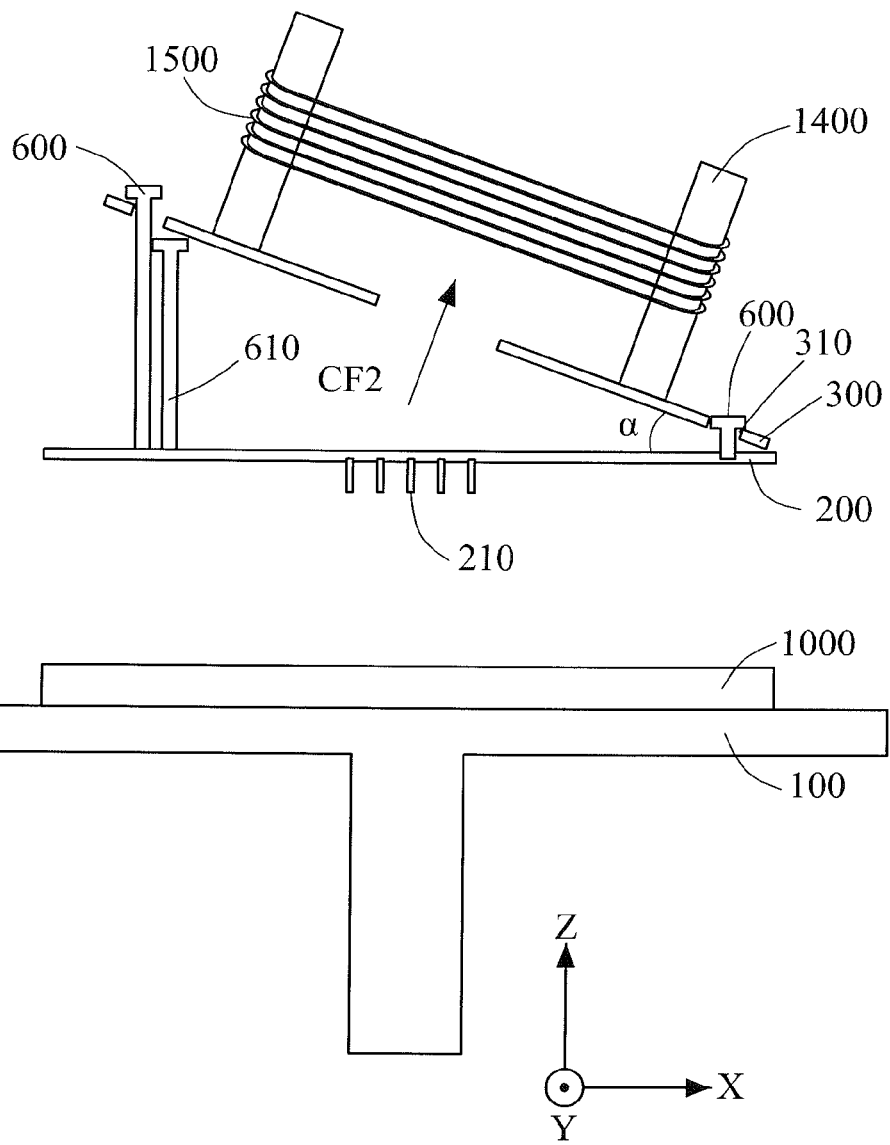
FIG. 6 illustrates a testing assembly for testing magnetic sensors according to yet another embodiment of the present invention.

Please refer to FIG. 6. FIG. 6 illustrates a testing assembly for testing magnetic sensors according to yet another embodiment of the present invention. The testing assembly comprises a testing interface and a magnetic-field generator. The testing interface is the same as the testing interface shown in FIG. 1 and comprises the same base plate 200 and a plurality of testing terminals 210 shown in FIG. 1. In this embodiment, the wafer 1000 and the wafer support 100 are also the same as the ones shown in FIG. 1. Their details are omitted here. In this embodiment, the detachable magnetic-field generator, same as the detachable magnetic-field generator shown in FIG. 4, mainly comprises a coil support 1400 and one coil 1500 winding around the coil support 1400. Their details are omitted, too. Although the same positioning plate 300 and a plurality of fasteners 600 are used in this embodiment, the way they are coupled to the base plate 200 is different. In this embodiment, the detachable magnetic-field generator is installed on the positioning plate 300 closely but the positioning plate 300 is installed on the base plate 200 in a titled way such that the positioning plate 300 forms an angle α with respect to the base plate 200. The angle α depends on the length of a positioning pin 610. The angle α makes the coil support 1400 not perpendicular to the base, so the coil 1500 is not parallel to the base plate.

Figure 7B:
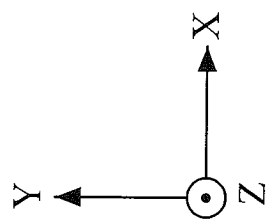
FIGS. 7(A) and 7(B) illustrate the magnetic fields generated from the magnetic-field generator of the testing assembly of FIG. 6.
Figure 7A:
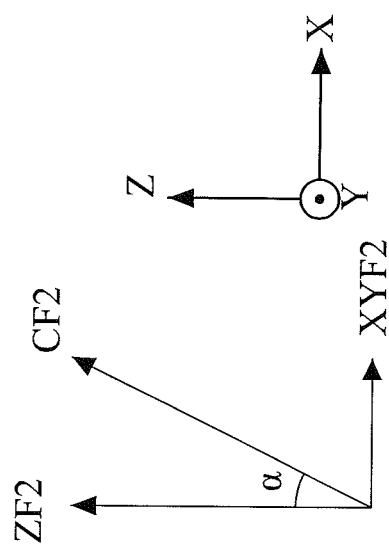

Please refer to FIGS. 7(A) and 7(B). FIGS. 7(A) and 7(B) illustrate the magnetic fields generated from the magnetic-field generator of the testing assembly of FIG. 6. When electrical current is supplied to the coil 1500 that in a top view the electrical current flowing in the coil 1500 follows a counterclockwise direction, inside the coil 1500 a magnetic field CF2 perpendicular to the coil 1500 would be generated. Since the coil 1500 is no longer parallel to the base plate, the magnetic field CF2 would not perpendicular to the base plate. In FIG. 7(A), the magnetic field CF2 is divided into a magnetic field ZF2 along z-axis and a magnetic field XYF2 in the x-y plane. The magnetic field ZF2 forms the angle α with respect to the magnetic field CF2. The magnetic field XYF2 in the x-y plane can be further divided into a magnetic field XF2 along x-axis and a magnetic field YF2 along y-axis. The magnetic field XF2 forms an angle β with respect to the magnetic field XYF2. The angle β depends on the orientation of the positioning plate 300. Since the testing terminals 210 are disposed in an area corresponding to the center area of the coil 1500, the magnetic field CF1 would be the external magnetic field felt by the magnetic sensor under test while the testing terminals 210 are electrically coupled to the magnetic sensor. The magnitude of the magnetic field CF1 depends on the current supplied to the coil 1500. The magnitudes of the magnetic field ZF2, XF2 and YF2 depend on the tilted angle α between the positioning plate 300 and the base plate and the orientation (angle β) of the positioning plate 300.

In the embodiment of FIGS. 6, 7(A) and 7(B), by adjusting the magnitude of the current supplied to the coil 1500 and by adjusting the titled angle α and the angle β, one can create different kinds of magnetic fields in the x-y-z space.

Figure 8:
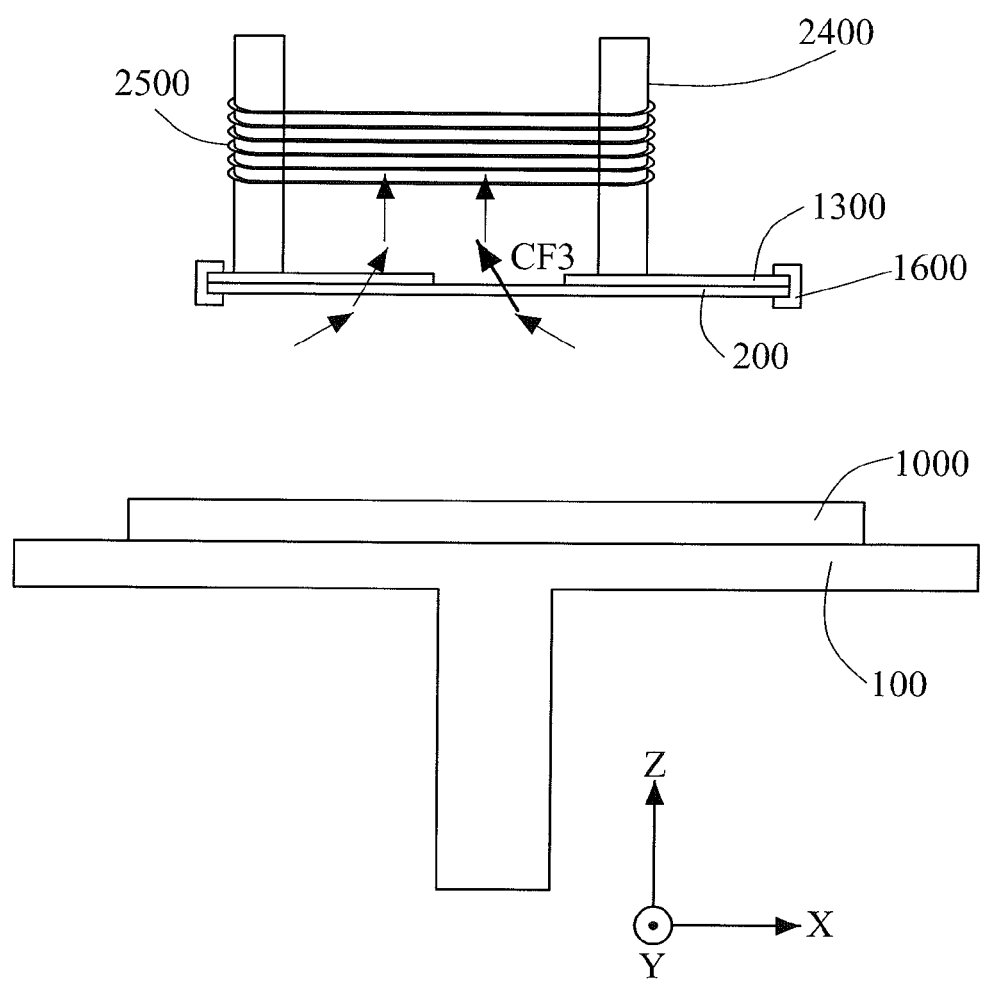
FIG. 8 illustrates a testing assembly for testing magnetic sensors according to yet another embodiment of the present invention.

Please refer to FIG. 8. FIG. 8 illustrates a testing assembly for testing magnetic sensors according to yet another embodiment of the present invention. The testing assembly comprises a testing interface and a magnetic-field generator. The testing interface is the same as the testing interface shown in FIG. 1 and comprises the same base plate 200 and a plurality of testing terminals 210 shown in FIG. 1. However, in order to clearly illustrate directions of the magnetic field generated from the coil 2500, the testing terminals 210 are omitted from FIG. 8. In this embodiment, the wafer 1000 and the wafer support 100 are also the same as the ones shown in FIG. 1. Their details are omitted here. In this embodiment, the detachable magnetic-field generator, same as the detachable magnetic-field generator shown in FIG. 4, mainly comprises a coil support 2400 and one coil 2500 winding around the coil support 1400. Their details are omitted, too. Although the same positioning plate 1300 and fastener(s) 1600 are used in this embodiment, the way the detachable magnetic-field generator is coupled to the positioning plate 1300 is different. In this embodiment, the detachable magnetic-field generator is installed on the positioning plate 1300 in an eccentric way such that the center area of the magnetic-field generator is off from the center area of the positioning plate 1300 hence off from the center area of the base plate. Therefore, the area occupied by testing terminals 210 does not align with the center area of the coil 2500.

When electrical current is supplied to the coil 2500 that in a top view the electrical current flowing in the coil 2500 follows a counterclockwise direction, inside the coil 2500 a magnetic field perpendicular to the coil 2500 would be generated. Since the testing terminals 210 are no longer disposed in the center of the coil 2500, the external magnetic field felt by the magnetic sensor under test would not be perpendicular to the base plate 200. In the FIG. 8, it is clear that the magnetic field CF3 would be the external magnetic field felt by the magnetic sensor while the testing terminals 210 are electrically coupled to the magnetic sensor. Similarly, the magnetic field CF3 can be divided into a magnetic field along z-axis (not shown) and a magnetic field in the x-y plane (not shown). The magnetic field in the x-y plane can be further divided into a magnetic field along x-axis (not shown) and a magnetic field along y-axis (not shown). The magnitudes of the magnetic field along z-axis, the magnetic field along x-axis and the magnetic field along y-axis depend on the current supplied to the coil 2500 and which direction the magnetic-field generator shifts to.

In the embodiment of FIG. 8, by adjusting the magnitude of the current supplied to the coil 2500 and by adjusting how the coil 2500 is shifted, one can create different kinds of magnetic fields in the x-y-z space.

Figure 9:
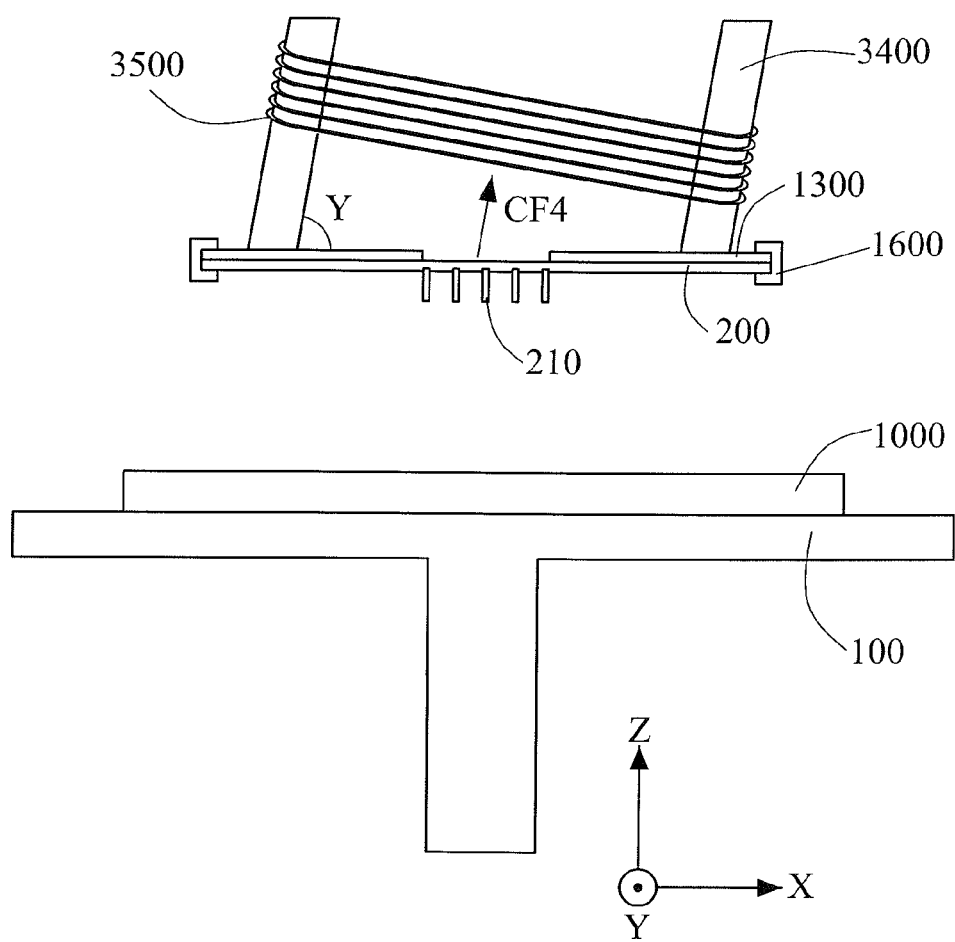
FIG. 9 illustrates a testing assembly for testing magnetic sensors according to yet another embodiment of the present invention.

Please refer to FIG. 9. FIG. 9 illustrates a testing assembly for testing magnetic sensors according to yet another embodiment of the present invention. The testing assembly comprises a testing interface and a magnetic-field generator. The testing interface is the same as the testing interface shown in FIG. 1 and comprises the same base plate 200 and a plurality of testing terminals 210 shown in FIG. 1. In this embodiment, the wafer 1000 and the wafer support 100 are also the same as the ones shown in FIG. 1. Their details are omitted here. In this embodiment, the detachable magnetic-field generator, different from the detachable magnetic-field generator shown previously, mainly comprises a tilted coil support 3400 and one coil 3500 winding around the tilted coil support 3400. Same positioning plate 1300 and fastener(s) 1600 are used in this embodiment and the way the detachable magnetic-field generator is coupled to the positioning plate 1300 is the same. In this embodiment, the tilted coil support 3400 is not perpendicular to the base plate 200 and forms an angle γ with respect to the base plate 200. Therefore, the coil 3500 winding around the tilted coil support 3400 is not parallel to the base plate 200.

When electrical current is supplied to the coil 3500 that in a top view the electrical current flowing in the coil 3500 follows a counterclockwise direction, inside the coil 3500 a magnetic field CF4 perpendicular to the coil 3500 would be generated. Since coil 3500 is no longer parallel to the base plate, the magnetic field CF4 is not perpendicular to the base plate. The external magnetic field felt by the magnetic sensor under test is the magnetic field CF4 which is not perpendicular to the base plate 200. Similarly, the magnetic field CF4 can be divided into a magnetic field along z-axis (not shown) and a magnetic field in the x-y plane (not shown). The magnitudes of the magnetic field along z-axis and the magnetic field in the x-y plane depend on the current supplied to the coil 3500 and the tilted angle γ between the titled coil support 3400 and the base plate 200.

Figure 10:
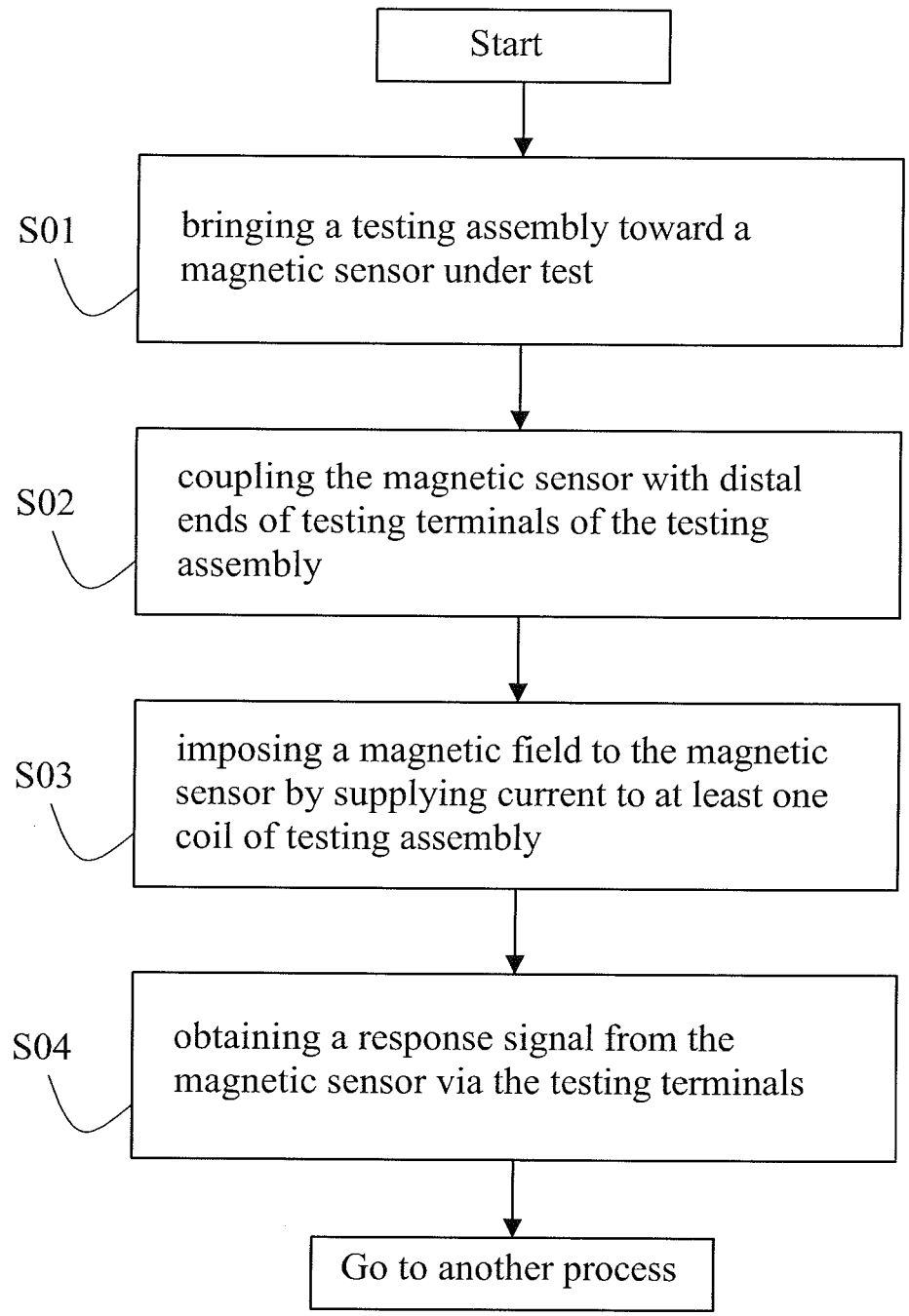
FIG. 10 is a flowchart showing the method for testing a magnetic sensor by using the testing assembly of the present invention according to one embodiment of the present invention.

Please refer to FIG. 10. FIG. 10 is a flowchart showing the method for testing a magnetic sensor by using the testing assembly of the present invention according to one embodiment of the present invention. In this embodiment, this method starts from step S01.

At step S01, a test assembly according to one of the embodiments of the present invention is brought toward a magnetic sensor under test. The magnetic sensor under test is formed within the wafer 1000 shown in FIG. 1, 4, 6, 8 or 9 and supported by the wafer support 1100 shown in FIG. 1, 4, 6, 8 or 9. The test assembly may be the test assembly shown in FIG. 1, 4, 6, 8 or 9 and it comprises a testing interface and a detachable magnetic-field generator installed on the testing interface. The testing interface mainly comprises a base plate 200 and a plurality of testing terminals 210 shown in FIG. 1, 4, 6, 8 or 9. In this embodiment, the test assembly can move downward in order to be brought toward the magnetic sensor under test. Alternatively, the wafer with the magnetic sensor under test formed therein can move upward in order for the test assembly to be brought toward the magnetic sensor under test. Both ways fall within the cope of the present invention. In a case where the magnetic sensor under test is within a packaged integrated circuit (IC), the packaged IC can be put in a socket with testing terminals formed on one side and the detachable magnetic-field generator formed on the opposite side. Then, this method goes to step S02.

At step S02, the magnetic sensor is coupled with distal ends of the testing terminals. In a case where the magnetic sensor is formed within the wafer 1000, a plurality of bonding pads and/or testing pads would be exposed from a surface of the wafer 1000 and the distal ends of the testing terminals would make physical contact with the bonding pads and/or testing pads while the testing assembly is close enough to the wafer 1000. Or, in a case where the magnetic sensor is formed within a packaged IC, a lead frame, a plurality of BGA balls, etc. would be exposed from a package molding and the distal ends of the testing terminals would make physical contact with the lead frame, a plurality of BGA balls, etc. Then, this method goes to step S03.

At step S03, a magnetic field is imposed by supplying current to at least one coil of the detachable magnetic-field generator. Depending on the types of the magnetic sensor under test and the testing items, the coil could be the four coils shown in FIG. 1 capable of generating a magnetic field in the x-y plane or the one coil shown in FIG. 4 capable of generating a magnetic field along z-axis or the one coil shown in FIG. 6, 8 or 9 capable of generating a magnetic field in the x-y-z space. The direction and magnitude of the supplied current depend on the magnetic field required. The magnetic field imposed could be a magnetic field of fixed magnitude and fixed direction or it could be a magnetic field with its magnitude and direction varied with time. Then, this method goes to step S04.

At step S04, a response signal is obtained from the magnetic sensor via the testing terminals. After the magnetic field is imposed at step S03, the magnetic sensor under test would feel the magnetic field imposed and respond to the magnetic field imposed. The response signal can be collected via the testing terminals. When the magnetic field imposed has a fixed magnitude and a fixed direction, the response signal may also be fixed. When the magnetic field imposed has a magnitude varied with time and a direction varied with time, the response signal may also vary with time. Then, this method goes to another process.

After the response is obtained via the testing terminals, another process can be performed. This another process can be the method for testing a magnetic sensor performed with different test conditions or on another magnetic sensor. Or, this another process can be a determination process used to determine whether the magnetic sensor that has been tested meets a spec based on the response signal obtained at the step S04. Or, this another process can be a marking process used to mark the magnetic sensor that has been tested but failed to pass.

It is noted that one or more of the steps S01-S04 and the another process may be practiced with various computer system configurations including hand-held hardware units, microprocessor systems, microprocessor-based or programmable consumer electronics, minicomputers, mainframe computers and the like. The one or more steps/process can also be practiced in distributed computing environments where tasks are performed by remote processing hardware units that are linked through a network. Or, the one or more steps/process can also be fabricated as computer-readable code on a non-transitory computer-readable medium. The non-transitory computer-readable medium is any data storage hardware unit that can store data, which can be thereafter be read by a computer system.

The embodiments of the present invention provide a flexible and inexpensive testing assembly for testing magnetic sensors and a method for testing magnetic sensors by using such a testing assembly. This testing assembly is compatible with different kinds of testers and is capable of measuring sensing performance along z-axis (one dimensional), performance in the x-y plane (two dimensional) or performance in the x-y-z space (three-dimensional). Because the detachable magnetic-field generators of the present invention is coupled to the testing interface in a detachable fashion, it is convenient to be replaced, modified, cleaned and repaired off site. Furthermore, the coil/coils used in the detachable magnetic-field generators of the present invention can be arranged in different orientations with respect to the magnetic sensors under test, so flexibility is introduced into the apparatus used to test the magnetic sensors. For example, the coil/coils may be off the plane of the magnetic sensors (substrate with the magnetic sensors thereon) and form an included angle with the magnetic sensors (substrate). For example, the coils may comprise any numbers of coils and be arranged along any direction either parallel to x-axis or y-axis or not parallel to x-axis or y-axis. Although each embodiment has its own feature that is different from other embodiments, features from different embodiments may be combined in any way to create a modified embodiment. All the variations and modifications thereof fall in the scope of the present invention which is defined by the appended claims.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A testing assembly for testing a magnetic sensor, comprising:
    a testing interface having a base plate and plurality of testing terminals, the base plate having a first side and a second side opposite to the first side, the plurality of testing terminals arranged on the first side of the base plate;
    a detachable magnetic-field generator, arranged on the second side of the base plate in a detachable fashion, having a coil support and at least one coil winding around the coil support;
    wherein the coil support has four vertical portions perpendicular to the base plate and the at least one coil has four coils winding the four vertical portions respectively, two of the four coils are configured to generate a magnetic field along a first direction parallel to the base plate and the other two of the four coils are configured to generate a magnetic field along a second direction parallel to the base plate and perpendicular to the first direction.

2. The testing assembly according to claim 1, wherein the testing assembly is configured to be installed into a tester and the tester comprise a wafer support to support a wafer having magnetic sensors to be tested.

3. The testing assembly according to claim 1, wherein the testing assembly is configured to be installed into a tester and the tester is configured to test a packaged integrated circuit (IC) having magnetic sensors to be tested.

4. The testing assembly according to claim 2, wherein distal ends of the testing terminals are configured to contact the wafer or the packaged IC.

5. The testing assembly according to claim 1, wherein the coil support has at least two legs parallel to the base plate and the at least one coil comprises at least two coils winding the at least two legs respectively.

6. A method for testing a magnetic sensor, comprising:
    bringing a testing assembly toward the magnetic sensor, the testing assembly comprising:
        a testing interface having a base plate and plurality of testing terminals, the base plate having a first side and a second side opposite to the first side, the plurality of testing terminals arranged on the first side of the base plate;
        a detachable magnetic-field generator, arranged on the second side of the base plate in a detachable fashion, having a coil support and at least one coil winding around the coil support;
    coupling the magnetic sensor with distal ends of the testing terminals;
    imposing a magnetic field to the magnetic sensor by supplying current to the at least one coil;
    obtaining a response signal from the magnetic sensor via the testing terminals;
    wherein the coil support has four vertical portions perpendicular to the base late and the at least one coil has four coils winding the four vertical portions respectively, two of the four coils are configured to generate a magnetic field along a first direction parallel to the base plate and the other two of the four coils are configured to generate a magnetic field along a second direction parallel to the base plate and perpendicular to the first direction.

7. The method for testing a magnetic sensor according to claim 6, wherein the magnetic sensor is formed within a wafer or a packaged IC.

8. The method for testing a magnetic sensor according to claim 6, wherein the coil support is made from iron, a ferrite material, permalloy, an insulating material or a combination thereof.

* * * * *